(12) United States Patent
Aida et al.

(10) Patent No.: US 8,421,240 B2
(45) Date of Patent: Apr. 16, 2013

(54) SENSOR DEVICE AND METHOD OF MANUFACTURING THE SENSOR DEVICE

(75) Inventors: Kazuhiko Aida, Tokyo (JP); Katsumi Hashimoto, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 337 days.

(21) Appl. No.: 12/753,305

(22) Filed: Apr. 2, 2010

(65) Prior Publication Data

US 2010/0252932 A1    Oct. 7, 2010

(30) Foreign Application Priority Data

Apr. 7, 2009  (JP) .................................. 2009-93398

(51) Int. Cl.
*H01L 23/525* (2006.01)
*H01L 23/485* (2006.01)

(52) U.S. Cl.
USPC .................................. 257/776; 257/E23.019

(58) Field of Classification Search .................. 257/773, 257/776, E23.011, E23.145–E23.15
See application file for complete search history.

(56) References Cited

U.S. PATENT DOCUMENTS

| | | | |
|---|---|---|---|
| 7,540,191 B2 * | 6/2009 | Hashimoto et al. | 73/514.29 |
| 2002/0158271 A1 | 10/2002 | Kouchi et al. | |
| 2004/0056355 A1 * | 3/2004 | Minami et al. | 257/758 |
| 2005/0051898 A1 | 3/2005 | Minami et al. | |
| 2006/0249843 A1 * | 11/2006 | Hashimoto | 257/734 |
| 2008/0054384 A1 | 3/2008 | Uematsu et al. | |
| 2009/0032968 A1 * | 2/2009 | Kemerling et al. | 257/776 |

FOREIGN PATENT DOCUMENTS

| | | |
|---|---|---|
| JP | 07-260821 A | 10/1995 |
| JP | 11-339473 A | 12/1999 |
| JP | 2002-324395 A | 11/2002 |
| JP | 2003-101033 A | 4/2003 |
| JP | 2003-166998 A | 6/2003 |
| JP | 2004-111796 A | 4/2004 |
| JP | 2008-060039 A | 3/2008 |

OTHER PUBLICATIONS

Japanese Office action in counterpart application No. JP2010-220966 (English translation); Nov. 30, 2010.

\* cited by examiner

*Primary Examiner* — Daniel Whalen
*Assistant Examiner* — Raj R Gupta
(74) *Attorney, Agent, or Firm* — Pearne & Gordon LLP

(57) ABSTRACT

A sensor device includes a substrate which includes an element forming region, a plurality of sensor elements formed in the element forming region, a plurality of connection pads formed on a region of the substrate other than the element forming region, a plurality of first wiring formed on the substrate and electrically connected with the plurality of sensor elements, a plurality of second wiring formed on the substrate and electrically connected with the plurality of connection pads, a plurality of third wiring formed on a different layer to the plurality of first wiring and the plurality of second wiring and formed to intersect with the plurality of first wiring and the plurality of second wiring, and an insulation layer formed between the plurality of first wiring, the plurality of second wiring and the plurality of third wiring.

7 Claims, 11 Drawing Sheets

Expanded Region A

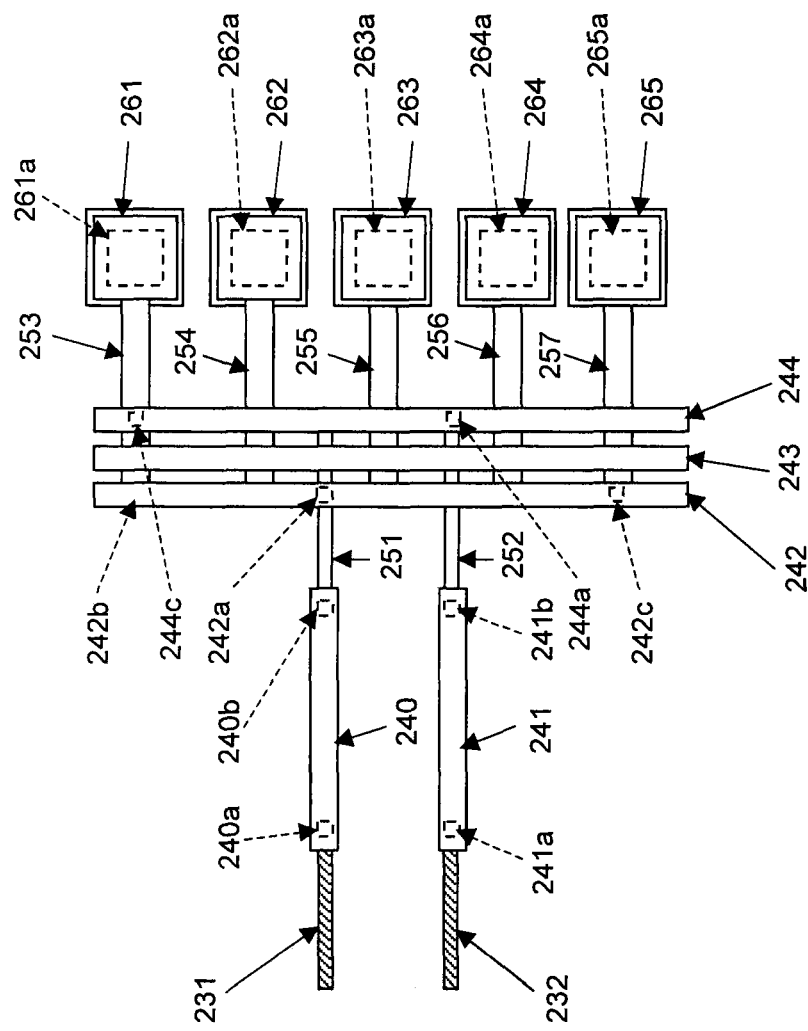
Fig. 6    Expanded Region A

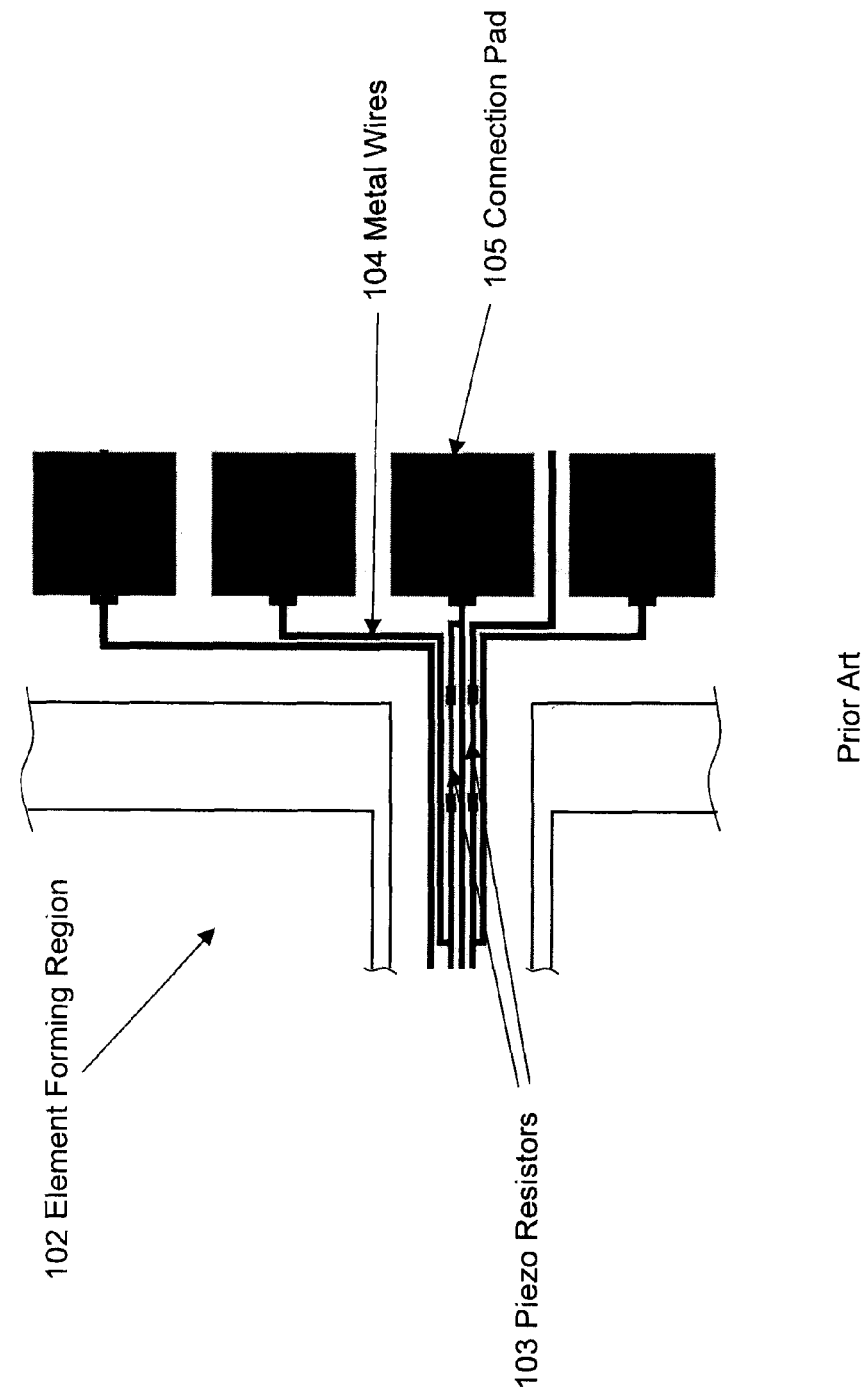

SENSOR DEVICE AND METHOD OF MANUFACTURING THE SENSOR DEVICE

CROSS-REFERENCE TO RELATED APPLICATIONS

This application is based upon and claims the benefit of priority from the prior Japanese Patent Application No. 2009-093398, filed on 7 Apr., 2009, the entire contents of which are incorporated herein by reference.

TECHNICAL FIELD

The present invention is related to a sensor device which includes a pad for connecting to an external circuit and a method of manufacturing the sensor device.

BACKGROUND OF THE INVENTION

1. Field of the Invention

In recent years, small scale and light electronic devices with multi-functionality and high functionality are becoming widespread and a greater level of integration of installed electronic components is being demanded. In response to such demands, the number of each type of electronic component being manufactured as a semiconductor device is increasing. Consequently, small scale and light electronic devices such as a sensor etc for detecting mechanical quantity are being manufactured using semiconductor devices apart from semiconductor devices manufactured as circuit components. For example, A moving part which displaces is formed according to an external force on a semiconductor substrate in an acceleration sensor or angular velocity sensor having a small scale and simple structure using MEMS (Micro Electro Mechanical Systems) technology, and a mechanical sensor (called a piezo resistor sensor) in which the displacement of this moving part is detected using a piezo resistor is realized.

A specific example of the above stated mechanical sensor is shown in FIG. 10 and FIG. 11. FIG. 10 is a planar diagram which shows a triaxial acceleration sensor 100 which uses a piezo resistor. FIG. 11 is a planar diagram which shows the structure of an expanded region A part shown in FIG. 10. In FIG. 10, an acceleration sensor 100 is arranged with a substrate 101 which includes an element forming region 102 in which sensor elements having the above stated moving part are formed. A plurality of piezo resistors 103 which detect the displacement of the moving part in a triaxial direction XYZ are arranged in 4 locations within this element forming region. In addition, a plurality of connection pads 105 is formed in a periphery region of the element forming region 102. The plurality of connection pads 105 are a group of pads for electrically connecting the interior of the acceleration sensor 100 with an external circuit.

In FIG. 11, the piezo resistors 103 within the element forming region 102 are electrically connected with the connection pads 105 via a plurality of metal wires 104. The metal wires 104 externally output a detection signal of the piezo resistors 103 from the connection pads 105 and supply a current and voltage etc to the interior of the acceleration sensor 100.

The package size of the acceleration sensor 100 tends to become miniaturized and the wire width of the metal wires 104 and size of the connection pads 105 also tends to become miniaturized. As a result, when the wire width of each metal wire 104 and the size of each connection pad 105 are different, variation in resistance values of a part which includes the metal wires 104 and connection pads 105 is produced and causes a current which flows in each piezo resistor 103 to fluctuate. Consequently, the variation in resistance values of the part which includes the metal wires 104 and connection pads 105 influences the detection sensitivity of the sensor parts.

An acceleration sensor which reduces the influence on the detection sensitivity of a sensor due to variation in resistance values as stated above is disclosed in Japan Laid Open Patent 2003-101033. In this acceleration sensor, each resistance value becomes approximately equal by adjusting the shape of an extraction electrode pattern which connects the piezo resistors with external connection terminals.

2. Description of the Related Art

However, because a mechanical sensor which includes an acceleration sensor such as that stated above, is used for a variety of purposes, the arrangement of a connecting external circuit and connection terminals of an external IC are also wide and varied. As a result, it is necessary to align the arrangement of connecting pads of a mechanical sensor according to the function and arrangement of connection terminals arranged on an external circuit or external IC. That is, it is necessary to change the design of the internal wiring pattern according to the arrangement of connection terminals of a connecting external circuit or external IC which restricts the level of design freedom and also causes an increase in manufacturing costs of the mechanical sensor.

In the acceleration sensor 100 shown in FIG. 10 and FIG. 11, a plurality of piezo resistors forms a bridge circuit which corresponds to each triaxial XYZ respectively and acceleration is detected by detecting a change of current which flows in each bridge circuit according to the acceleration which is applied. That is, the resistance values of each piezo resistor changes according to a XYZ triaxial displacement of the moving part, and the XYZ triaxial acceleration is detected by a change in the current which flows when each bridge circuit is in a nonequilibrium state. As a result, in a state in which an external force is not applied to the acceleration sensor 100, it is necessary to design a wire pattern so that an equilibrium state in which a current does not flow in each bridge circuit is maintained while also considering the resistance value of a wire which connects each piezo resistor with a connection pad.

Therefore, design and manufacture is difficult due to the above reasons as in the acceleration sensor 100 shown in FIG. 10 and FIG. 11 when changing the internal wiring pattern according to the function and arrangement of a connecting external circuit or external IC in the case where a wire pattern is formed by one layer of metal wires. That is, according to a request from the external circuit or external IC, it requires time and effort to change a wiring pattern design and prepare a mask suitable for the design change, the design burden and manufacturing burden is increased leading to an increase in manufacturing costs.

BRIEF SUMMARY OF THE INVENTION

A sensor device related to one embodiment of the present invention includes a substrate which includes an element forming region, a plurality of sensor elements formed in the element forming region, a plurality of connection pads formed on a region of the substrate other than the element forming region, a plurality of first wiring formed on the substrate and electrically connected with the plurality of sensor elements, a plurality of second wiring formed on the substrate and electrically connected with the plurality of connection pads, a plurality of third wiring formed on a different layer to the plurality of first wiring and the plurality of second wiring and formed to intersect with the plurality of first wiring and the plurality of second wiring, and an insulation layer formed between the plurality of first wiring, the plurality of second wiring and the plurality of third wiring, and wherein a plurality of through holes are formed in a position at which the plurality of first wiring, the plurality of second wiring and the plurality of third wiring intersect.

A method of manufacturing a sensor device related to one embodiment of the present invention includes forming an element forming region in which a plurality of sensor elements are formed on a substrate, forming a plurality of connection pads in a region apart from the element forming region on the substrate, forming a plurality of first wiring which are electrically connected with the plurality of sensor elements on the substrate, forming a plurality of second wiring which are electrically connected with the plurality of connection pads on the substrate, forming a plurality of third wiring on a layer which is different to the layer on which the plurality of first wiring and the plurality of second wiring are formed, the plurality of third wiring being formed to intersect the plurality of first wiring and the plurality of second wiring, forming an insulation layer between the plurality of first wiring, the plurality of second wiring and the plurality of third wiring, forming a plurality of through holes on the insulation layer corresponding to a position at which the plurality of first wiring, the plurality of second wiring and the plurality of third wiring intersect, and selecting the plurality of through holes, changing a position which electrically connects the plurality of first wiring, the plurality of second wiring and the plurality of third wiring and changing a wiring pattern which connects the plurality of sensor devices with the plurality of connection pads.

BRIEF DESCRIPTION OF THE DRAWINGS

FIG. 6 is a diagram which shows an example of changing a wiring pattern in the expanded region A shown in FIG. 1;

FIG. 11 is a diagram which shows the structure of an expanded region A in FIG. 10.

DETAILED DESCRIPTION OF THE INVENTION

Figure 1:
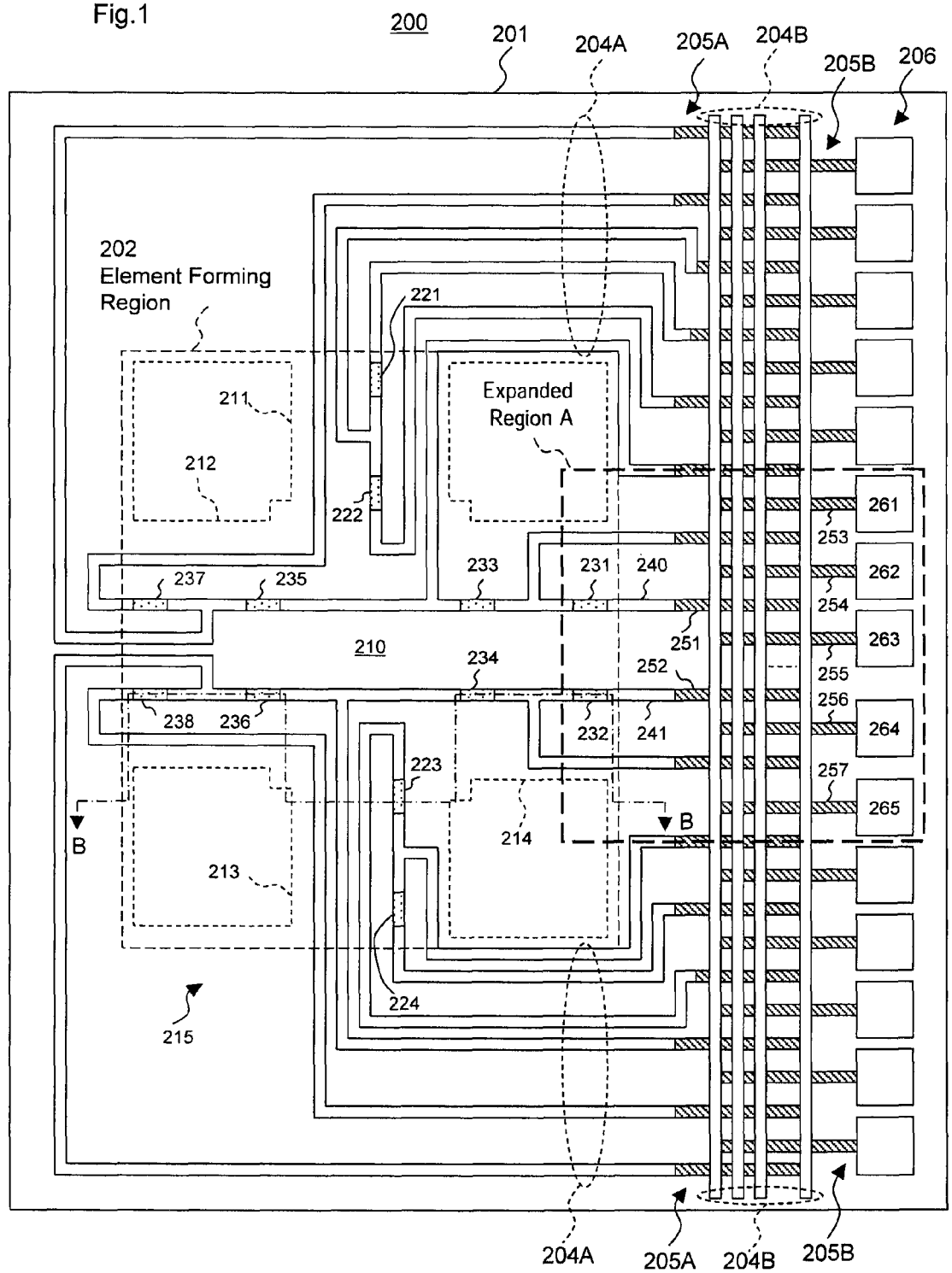
FIG. 1 is a diagram which shows the entire structure of an acceleration sensor related to one embodiment of the present invention.

An embodiment of the present invention will be explained in detail below while referring to the drawings. Furthermore, the invention applied to an acceleration sensor will be explained in the present embodiment.

(Sensor Structure)

Figure 2:
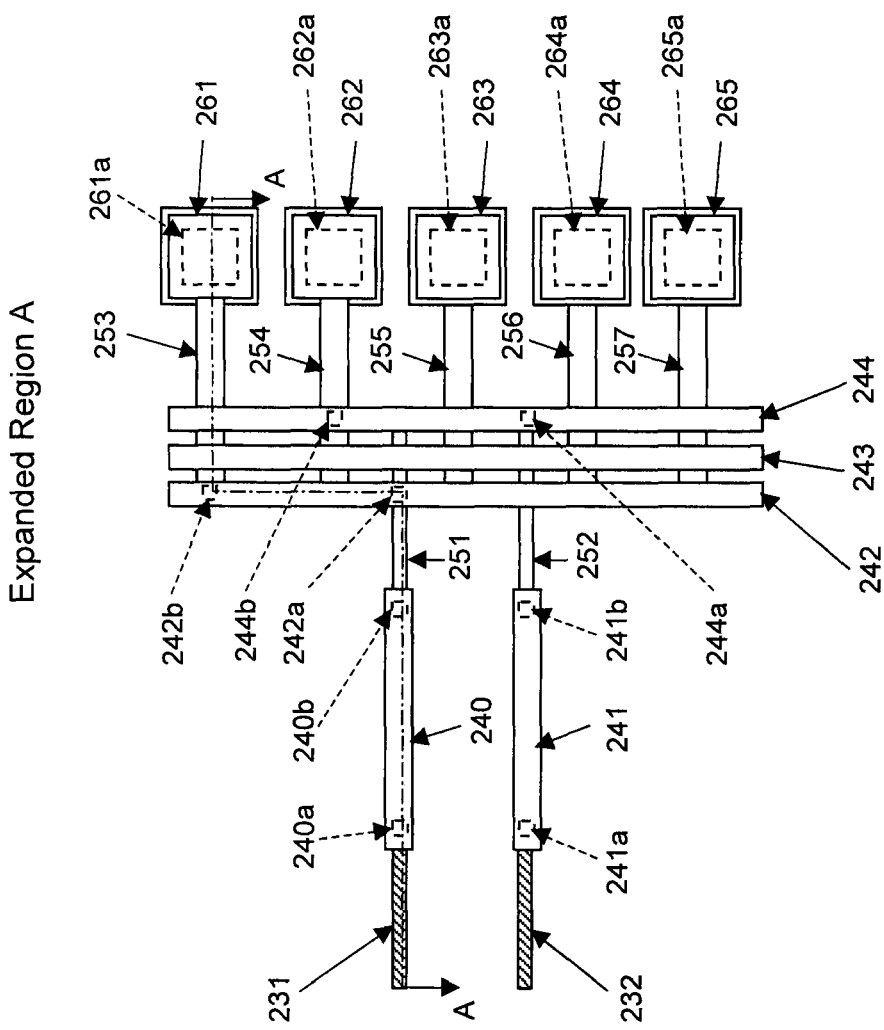
FIG. 2 is a diagram which shows the structure of the expanded region A in FIG. 1.
Figure 3:
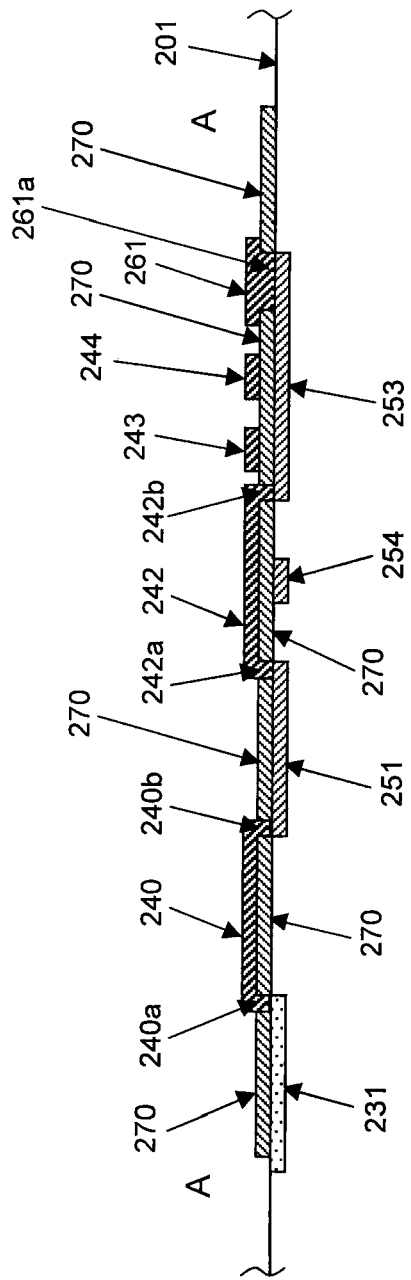
FIG. 3 is a diagram which shows a cross section seen from the line A-A in FIG. 2.

FIG. 1 is a planar view diagram which shows the entire structure of an acceleration sensor 200 related to the present embodiment. FIG. 2 is a planar view diagram which shows the structure of an expanded region A part shown in FIG. 1. FIG. 3 is a diagram which shows a cross section seen from the line A-A shown in FIG. 2.

In FIG. 1, the entire structure of the acceleration sensor 200 is arranged with a substrate 201 which includes an element forming region 202 in which sensor elements which have the above stated moving part are formed. In FIG. 1, 201 is an anchor junction part which joins an anchor part (not shown in the diagram) which forms a moving part, 211, 212, 213 and 214 are flexible parts which movably support the anchor junction part 210. 215 is a frame part which supports the flexible parts 211, 212, 213 and 214. 12 piezo resistors 221, 222, 223, 224, 231, 232, 233, 234, 235, 236, 237, and 238 which detect the displacement of the moving part are arranged in triaxial directions, X (horizontal direction in the FIG. 1), Y (vertical direction in the FIG. 1) and Z (perspective direction with respect the surface of the page in FIG. 1) in 4 locations on the flexible parts 211, 212, 213 and 214 within the element forming region 202. In the present embodiment, the piezo resistors 221, 222, 223, and 224 detect displacement in the Y axis direction, the piezo resistors 232, 234, 235, and 237 detect displacement in the X axis direction and piezo resistors 231, 233, 236, and 238 detect displacement in the Z axis direction. However, each axis direction set to these piezo resistors 221, 222, 223, 224, 231, 232, 233, 234, 235, 236, 237, and 238 is not limited. In addition, in FIG. 1, a plurality of connection pads 206 is formed in a right side part region further to the exterior than the element forming region 202. The plurality of connection pads 206 is a group of pads for electrically connecting the interior of the acceleration sensor 200 with an external circuit. Furthermore, the arrangement of the plurality of connection pads 206 is not limited to the region shown in FIG. 1. The arrangement of the connection pads 206 may be arbitrarily changed within a range which does not interfere with the element forming region 202.

In addition, a first upper layer wiring group 204A, a second upper layer wiring group 204B, a first lower layer wiring group 205A and a second lower layer wiring group 205B are formed above the substrate 201. The first upper layer wiring group 204A is a wiring group which electrically connects each of the piezo resistors 221, 222, 223, 224, 231, 232, 233, 234, 235, 236, 237, and 238, with the first lower layer wiring group 205A. The first lower layer wiring group 205A is a wiring group which electrically connects the first upper layer wiring group 204A with the second upper layer wiring group 204B. The second upper layer wiring group 204B is a wiring group which electrically connects the first lower layer wiring group 205A with the second lower layer wiring group 205B. The second lower layer wiring group 205B is a wiring group which electrically connects the second upper layer wiring group 204B with the plurality of connection pads 206. For example, the width of the first upper layer wiring group 204A, the second upper layer wiring group 204B, the first lower layer wiring group 205A and the second lower layer wiring group 205B is 2-3 μm, and the size of the connection pads 206 is 100×100 μm. Furthermore, these sizes are not limited.

Next, the structure of the expanded region A shown in FIG. 1 will be explained while referring to FIG. 2 and FIG. 3. In FIGS. 2, 231 and 232 are piezo resistors. One end of the piezo resistor 231 and 232 is electrically connected to one end of the upper layer wiring 240 and 241 which are included in the first upper layer wiring group 204A stated above. The upper layer wiring 240 and 241 are formed on a layer above the piezo resistors 231 and 232 via an insulation layer 270 (refer to FIG. 3). Contact holes 240a and 241a are formed on the insulation layer 270 between one end of the piezo resistors 231 and 232 and one end of the upper layer wiring 240 and 241. One end of the piezo resistors 231 and 232 and one end of the upper layer wiring 240 and 241 are electrically connected via the contact holes 240a and 241a.

Lower layer wiring 251 and 252 are formed on a lower layer on the other end side of the upper layer wiring 240 and 241 via the insulation layer 270 (refer to FIG. 3). The other end of the upper layer wiring 240 and 241 is electrically connected to one end of the lower layer wiring 251 and 252. Contact holes 240b and 241b are formed on the insulation layer 270 between the other end of the upper layer wiring 240 and 241 and the end of the lower layer wiring 251 and 252. The other end of the upper layer wiring 240 and 241 and the end of the lower layer wiring 251 and 252 are electrically connected via the contact holes 240b and 241b.

Upper layer wiring 242, 243, and 244 are formed via the insulation layer 270 (refer to FIG. 3) on a layer above the other end side of lower layer wiring 251 and 252. The upper layer wiring 242, 243, and 244 are formed to intersect in a perpendicular direction to the other end of the lower layer wiring 251 and 252. The other end of the lower layer wiring 251 and 252 are electrically connected to an intersection part between the upper layer wiring 242, 243, and 244. A contact hole 242a is formed on the insulation layer 270 on a part at which the lower layer wiring 251 and the upper layer wiring 242 intersect. A contact hole 244a is formed on the insulation layer 270 on a part at which the lower layer wiring 252 and the upper layer wiring 244 intersect. The intersection parts between the lower layer wiring 251 and 252 and the upper layer wiring 242 and 244 are electrically connected via the contact holes 242a and 244a. Furthermore, 3 upper layer wiring 242, 243, and 244 are shown in FIG. 2 are upper layer wiring corresponding to the second upper layer wiring group 204B shown in FIG. 1. However, the number of layer wirings shown in the diagrams is reduced to simply explanation. Actually, the same number or more of upper layer wiring group 204B as the connection pads 206 may be arranged.

Lower layer wiring 253, 254, 255, 256, and 257 are formed via the insulation layer 270 (refer to FIG. 3) on a lower layer of the upper layer wiring 242, 243, and 244. The upper layer wiring 242, 243, and 244 are formed to intersect in a perpendicular direction to the end of the lower layer wiring 252, 254, 255, 256 and 257. A contact hole 242b is formed on the insulation later 270 at a part where the lower layer wiring 253 and the upper layer wiring 242 intersect. A contact hole 244b is formed on the insulation layer 270 at a part where the lower layer wiring 254 and the upper layer wiring 244 intersect. The intersection parts between the lower layer wiring 253 and 254 and the upper layer wiring 242 and 244 are electrically connected via the contact holes 242b and 244b.

Connection pads 261, 262, 263, 264, and 265 are formed via the insulation layer 270 (refer to FIG. 3) on a layer above the other end of the lower layer wiring 253, 254, 255, 256 and 257. Contact holes 261a, 262a, 263a, 264a, and 265a are formed on the insulation layer 270 between the other end of the lower layer wiring 253, 254, 255, 256, and 257 and the connection pads 261, 262, 263, 265 and 265. The other end of the lower layer wiring 253, 254, 255, 256, and 257 and the connection pads 261, 262, 263, 264, and 265 are electrically connected via the contact holes 261a, 262a, 263a, 264a, and 265a.

Furthermore, other piezo resistors 221, 222, 223, 224, 233, 234, 235, 236, 257, and 238 outside the expanded region A stated above, are electrically connected to connection pads 206 via contact holes (not shown in the diagram) formed on the insulation layer 270 between the first upper layer wiring group 204A and the first lower layer wiring group 205A, and between the second upper layer wiring group 204B and second lower layer wiring group 205B.

(Manufacturing Method of the Acceleration Sensor 200)

Next, the manufacturing method of the acceleration sensor 200 shown in FIG. 1, FIG. 2 and FIG. 3 is explained while referring to FIG. 4 and FIG. 5. FIG. 4A, FIG. 4B, FIG. 4C and FIG. 4D are diagrams for explaining the manufacturing process based on a cross sectional structure of piezo resistors, lower layer wiring and upper layer wiring parts of the acceleration sensor 200 shown in FIG. 3, mainly by the line A-A in FIG. 2. FIG. 5A, FIG. 5B, FIG. 5C and FIG. 5D are diagrams for explaining the manufacturing process based on a cross sectional structure seen from the line B-B of an element forming region 202 part mainly shown mainly in FIG. 1.

First, the manufacturing process based on a cross sectional structure of piezo resistors, lower layer wiring and upper layer wiring parts of the acceleration sensor 200 shown in FIG. 3, is explained while referring to FIG. 4A, FIG. 4B, FIG. 4C and FIG. 4D.

Figure 4A:
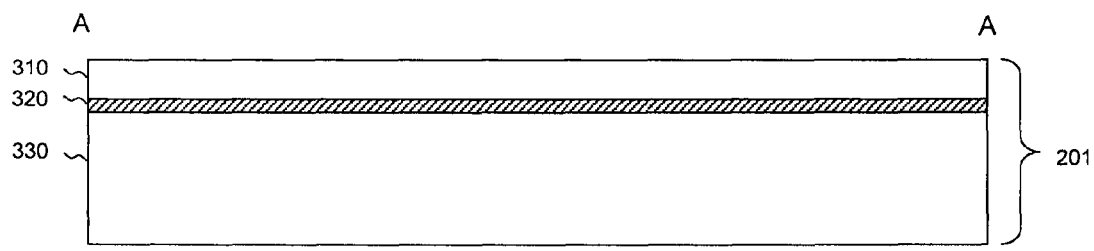
FIG. 4A is a diagram which shows a preparation process of a substrate.

(1) Preparation of a Substrate (Refer to FIG. 4A)

In the present embodiment, an SOI substrate 201 stacked with, for example, a silicon film 310, a silicon oxide film 320 and a silicon substrate 330 is prepared as a substrate 201. The silicon film 310 is a layer comprising the anchor junction 210, flexible parts 211, 212, 213, and 214 and frame part 215 shown in FIG. 1. The silicon oxide film 320 is a layer which joins the silicon film 310 and silicon substrate 330 together and functions as an etching stopper layer. The silicon substrate 330 is a layer comprising an anchor part (not shown in the diagram) and the frame part 215 shown in FIG. 1. The SOI substrate 201 us created by a SIMOX and bonding method. The SOI substrate 201 is obtained by the silicon film 310, silicon oxide film 320 and silicon substrate 330 which have a thickness of 5 μm, 2 μm and 600 μm respectively. The periphery of the acceleration sensor 200 is, for example, 2 mm×2 mm. Furthermore, these sizes are not limited.

Figure 4B:
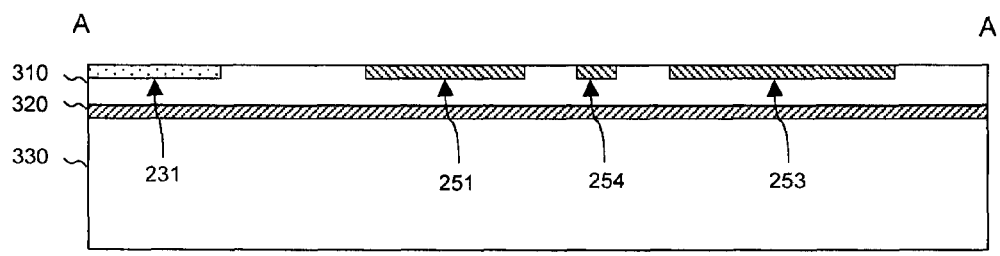
FIG. 4B is a diagram which shows a formation process of piezo resistors and lower layer wiring.

(2) Forming a Piezo Resistor Diffusion Mask and a Piezo Resistor (Refer to FIG. 4B)

Next, a diffusion mask for diffusing impurities corresponding to a piezo resistor is formed on the silicon mask 310 side of the SOI substrate. It is possible to use a silicon nitride film ($Si_3N_4$) or silicon oxide film ($SiO_2$) as the material of the diffusion mask. Here, a silicon nitride film is formed after forming a silicon oxide film on the entire surface of a silicon film using a thermal oxide or plasma CVD method, a resist pattern (not shown in the diagram) corresponding to the piezo resistors is formed on the silicon nitride film, and openings corresponding to the piezo resistors are formed on the silicon nitride film and the silicon oxide film by RIE (Reactive Ion Etching) and wet etching using thermal phosphoric acid. Next, the piezo resistors are formed by an ion implantation method using the diffusion mask. As a result, it is possible to form piezo resistors 231 in which the diffusion concentration of impurities in the surface is adjusted to a desired diffusion concentration (for example, $1\times10^{17}$-$1\times10^{19}$ atms/cm$^3$ or more preferably $1\times10^{18}$ atms/cm$^3$) as is shown in FIG. 4B.

(3) Forming a Lower Layer Wiring Diffusion Mask and a Lower Layer Wiring (Refer to FIG. 4B)

Next, after removing the piezo resistor diffusion mask using etching for example, a resist pattern of a diffusion mask corresponding to lower layer wiring on the silicon film 310 side is formed the same as forming the piezo resistor diffusion mask. Then, impurities corresponding to the lower layer wiring are diffused into the silicon film 310 side using a thermal diffusion method. As a result, it is possible to form lower layer wiring 251, 253, and 254 in which the diffusion concentration of impurities in the surface is adjusted to a desired diffusion concentration (for example, $1\times10^{19}$-$1\times10^{21}$ atms/cm$^3$) as is shown in FIG. 4B.

Figure 4C:
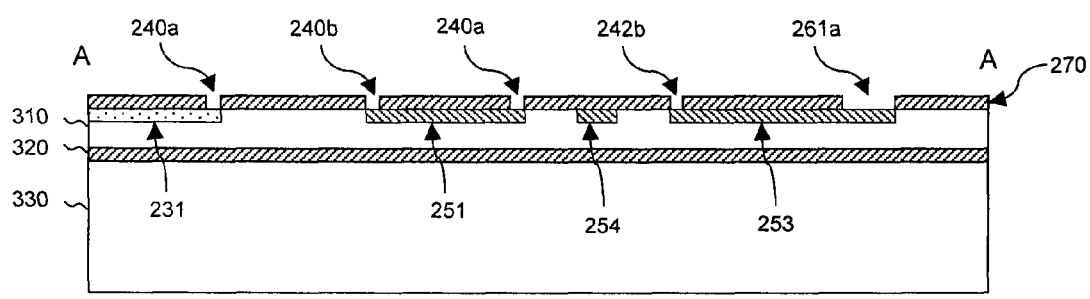
FIG. 4C is a diagram which shows a formation process of an insulation layer and a contact hole.

(4) Forming an Insulation Layer and Contact Hole (Refer to FIG. 4C)

Next, the insulation layer 270 is formed on the silicon film 310. For example, a SiO2 layer is formed as the insulation film 270 using a thermal oxidation or plasma CVD method. The contact holes 240a, 240b, 242a, 242b, and 261a shown in FIG. 3 are formed on the insulation layer 270 by RIE using a resist as a mask. These contact holes 240a, 240b, 242a, 242b, and 261a correspond to the layout of the piezo resistor 231, upper layer wiring 204 and 242 and the lower layer wiring 251, 253 shown in FIG. 2. That is, it is presumed that the wiring layout within the acceleration sensor is already decided in advance at the time of the formation of the contact holes. Furthermore, in the case where the wiring layout within the acceleration sensor is not decided in advance, the wiring layout maybe decided when the external circuit which is connected to the acceleration sensor 200 is decided and forming the contact holes and upper layer wiring may be performed last.

Next, a manufacturing process for forming moving parts (anchor junction part 210, flexible parts 211, 212, 213, and 214, anchor part) within the element forming region 202, and a frame part 215 which supports the moving parts, will be explained while referring to FIG. 5A, FIG. 5B, FIG. 5C and FIG. 5D. FIG. 5A, FIG. 5B, FIG. 5C and FIG. 5D show the manufacturing process order of a structure of a cross sectional part seen from line B-B shown in FIG. 1.

Figure 5A:
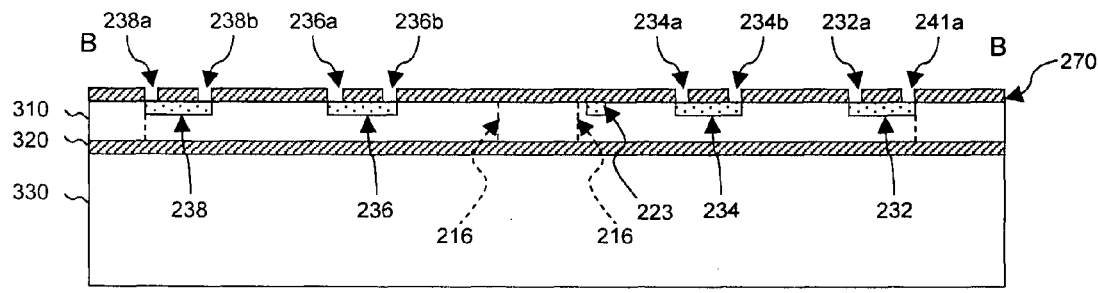
FIG. 5A is a diagram which shows a process of forming a silicon film.

(5) Processing a Silicon Film (Refer to FIG. 1 and FIG. 5A)

Figure 4D:
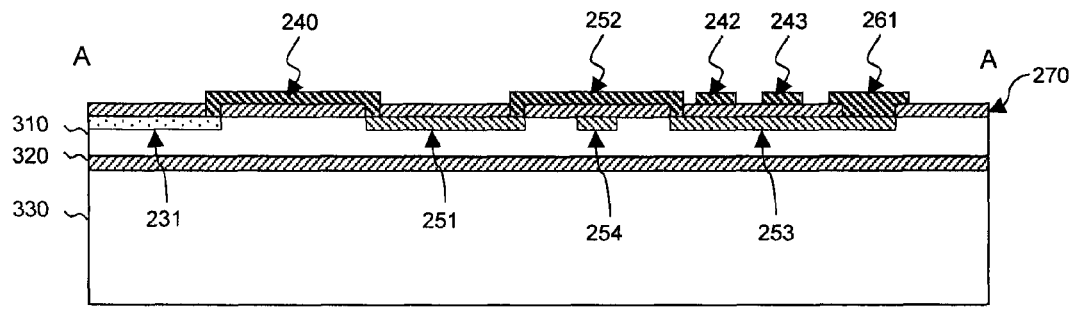
FIG. 4D is a diagram which shows a formation process of an upper layer wiring.

Etching by RIE for example if performed on the silicon film 310 until the upper surface of the silicon oxide film 310 is exposed, the opening 216 shown in FIG. 4D is formed and the frame part 215, the anchor junction part 210 and the flexible parts 211, 212, 213, and 214 shown in FIG. 1 are defined. Furthermore, before this process, in the formation of the insulation layer and contact hole (refer to FIG. 4C), the contact holes 232a, 234a, 234b, 236a, 236b, 238a, and 241a are formed on the insulation layer 270.

Figure 5B:
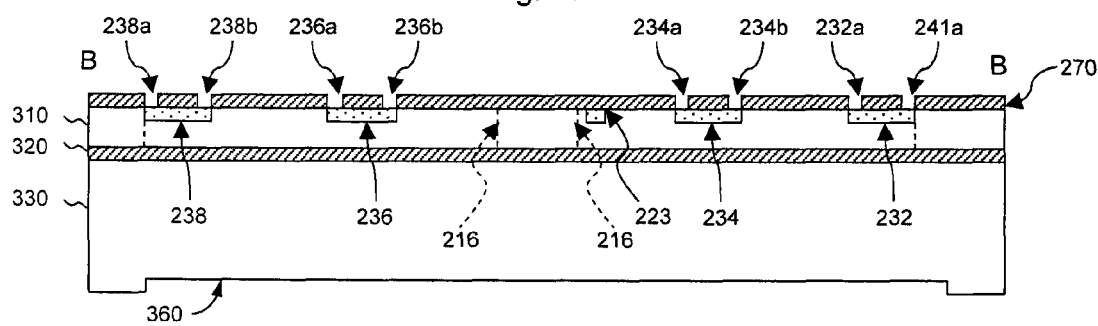
FIG. 5B is a diagram which shows a process of forming a silicon substrate.

(6) Processing of Silicon Substrate (Refer to FIG. 5B)

The silicon substrate 330 is etched using a mask which has an opening along the inner frame of the frame part 331 and a gap 360 is formed. The gap 360 is an interval necessary for shifting the anchor part 332 downwards (glass substrate side). For example, the gap is 5-10 µm. The gap 360 value can be appropriately set according to a sensor's dynamic range.

Figure 5C:
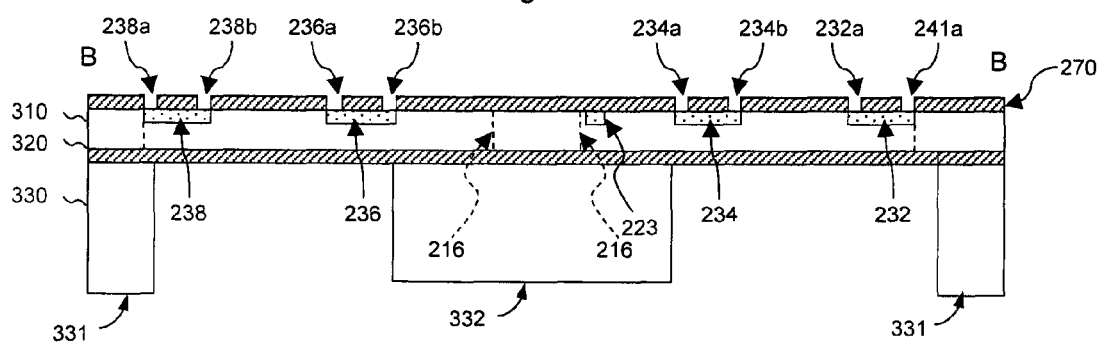
FIG. 5C is a diagram which shows a process of forming a silicon film.

(7) Processing of Silicon Substrate (Refer to FIG. 5C)

Next, a mask for defining the frame part 331 and anchor part 332 is formed on the bottom surface of the silicon substrate 330. The silicon substrate 330 is etched using this mask until the bottom surface of the silicon oxide film 320 is exposed. Using DRIE (Deep Reactive Ion Etching) as the etching process is preferred.

Figure 5D:
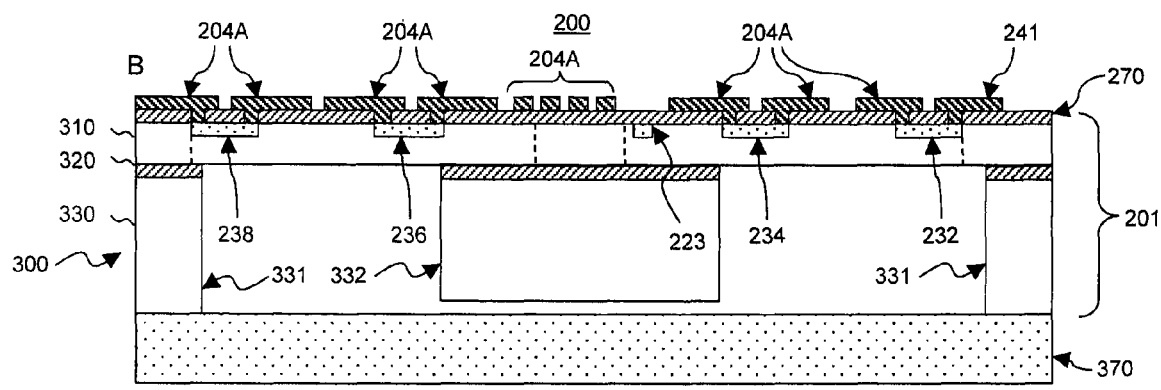
FIG. 5D is a diagram which shows a formation process of an upper layer wiring and a joining process of a glass substrate.

(8) Removal of Unnecessary Silicon Oxide Film (Refer to FIG. 5D)

The unnecessary silicon oxide film which was used as an etching stopper is removed by RIE or wet etching. In this way, the silicon oxide film 320 exists between the frame part 215 and frame part 331, the anchor junction part 210 and anchor part 332.

(9) Forming the Upper Layer Wiring and the Connection Pads (Refer to FIG. 2, FIG. 4D and FIG. 5D)

Next, the first upper layer wiring group 204A and the second upper layer wiring group 204B corresponding to the first lower layer wiring group 205A and the second lower layer wiring group 205B, and the connection pads 206 shown in FIG. 1 are formed. The first upper layer wiring group 204A and the second upper layer wiring group 204B, and the connection pads 206 are formed as masks from a metal material such as Al, Al—Si, Al—Nd by a sputter method and then patterned. FIG. 4D shows the case where upper layer wiring 240 and 242 corresponding to the lower layer wiring 251, 253, and 254 and the connection pads 261 are formed. FIG. 5D shows the case where the first upper layer wiring group 204A which connects the piezo resistors 232, 234, 236 and 238 is formed. Furthermore, a heating process is performed in order to form an ohmic contact between the upper layer 240 and first upper layer wiring group 204A and the piezo resistors 231, 232, 234, 236, and 238. Furthermore, a film such as a silicon nitride film ($Si_3N_4$) may be arranged as a protective film above the upper layer wiring 240 and 242 and first upper layer wiring group 204A. In addition, the second upper layer wiring group 204B is formed in the same way and a silicon nitride film ($Si_3N_4$) may be arranged as a protective film above the second upper layer wiring group 204B. A protective film may also be formed above the connection pads 206. However, after the protective film is formed, an opening is made in the protective film above the connection pads 206 and a connection point which electrically connects the connection pads 206 with an external circuit or external IC may be formed.

(10) Bonding a Glass Substrate (Refer to FIG. 5D)

Next, a sensor main part 300 and supporting substrate 370 are bonded together. When using glass as the material of the supporting substrate 370, Pyrex glass (registered trademark) which includes movable ions such Na ions is used and anodic bonding is used in bonding with an SOI substrate 201. Furthermore, an anti-sticking film (not shown in the diagram) of Cr etc may be formed on the upper surface of the glass substrate 370 using a sputter method in order to prevent the anchor part 332 from sticking to the upper surface of the supporting substrate 370 via an electrostatic attractive force at the time of anodic bonding. In this way, the sensor main part 300 and glass substrate 370 are bonded and the acceleration sensor 200 is formed.

As stated above, when manufacturing the acceleration sensor 200, wiring which connects the piezo resistors 221, 222, 223, 224, 231, 231, 234, 235, 236, 237, and 238 with the plurality of connection pads 206 is formed as the first upper layer wiring group 204A, second upper layer wiring group 24B, first lower layer wiring group 205A and second lower layer wiring group 205B. In addition, the second upper layer wiring group 204B is formed to intersect in a perpendicular direction with the first lower layer wiring group 205A and second lower layer wiring group 205B. Furthermore, a contact hole 242a is formed on the insulation layer 270 formed between the second upper layer wiring group 204B and the first lower layer wiring group 205A and the second lower wiring group 205B on each part at which the second upper layer wiring group 204B and the first lower layer wiring group 205A and the second lower wiring group 205B intersect. Then, by selecting a contact hole at an intersection part it is possible to arbitrarily change a wiring pattern which electrically connects the piezo resistors with the connection pads. Next, a specific example of a wiring pattern is explained.

For example, as is shown in FIG. 2, by selecting the contact holes 240a, 240b, 242a, 242b, and 261a the wiring pattern which electrically connects the piezo resistor 231 with the connection pads 261 goes through upper layer wiring 240→lower layer wiring 251→upper layer wiring 242→lower layer wiring 253. In addition, as is shown in FIG. 2, by selecting the contact holes 241a, 241b, 244a, 244b, and 262a, the wiring pattern which electrically connects the piezo resistor 232 with the connection pads 261 goes through upper layer wiring 241→lower layer wiring 252→upper layer wiring 244→lower layer wiring 254.

In addition, for example, as is shown in FIG. 6, by selecting the contact holes 240a, 240b, 242a, 242c, and 265a, the wiring pattern which electrically connects the piezo resistor 231 with the connection pads 265 goes through upper layer wiring 240→lower layer wiring 251→upper layer wiring 242→lower layer wiring 257. In addition, as is shown in FIG. 6, by selecting the contact holes 241a, 241b, 244a, 244c, and 261a, the wiring pattern which electrically connects the piezo resistor 232 with the connection pads 261 goes through upper layer wiring 241→lower layer wiring 252→upper layer wiring 244→lower layer wiring 253

As stated above, in the acceleration sensor 200 related to the present embodiment, it becomes possible to arbitrarily change a wiring pattern which electrically connects a piezo resistor with a connection pad simply by selecting a contact hole. Consequently, it is possible to change a wiring pattern which electrically connects a piezo resistor with a connection pad simply by changing the location of selecting a contact hole according to the function or arrangement of a connection terminal of an external circuit or external IC which is connected to the acceleration sensor 200. Therefore, in the acceleration sensor 200 related to the present embodiment, it becomes possible to easily change a wiring pattern according to the function or arrangement of a connection terminal arranged on an external circuit or external IC without changing the design or manufacturing process of a wiring pattern within the sensor. As a result, it is possible to significantly reduce the design side burden and manufacturing side burden when changing a wire pattern within a sensor and suppress an increase in manufacturing costs.

(Transformation Example of a Manufacturing Process)

Figure 7A:
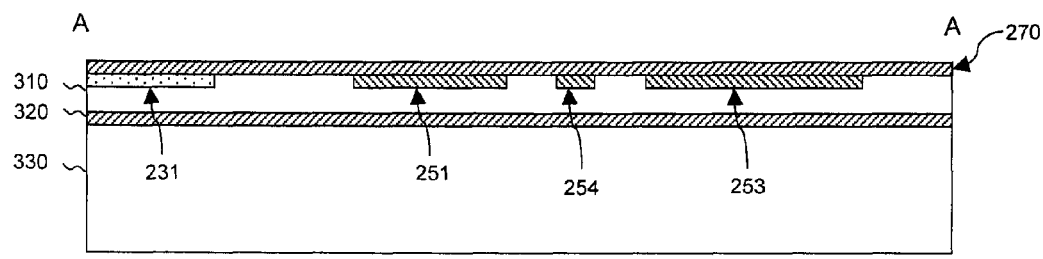
FIG. 7A is a diagram which shows a formation process of an insulation layer of the cross section line A-A shown in FIG. 2.
Figure 7B:
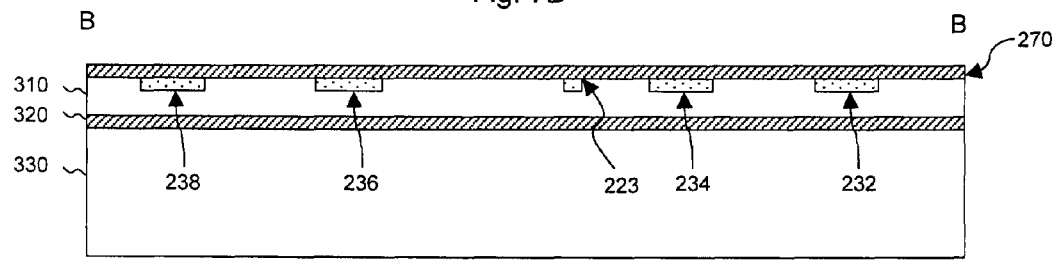
FIG. 7B is a diagram which shows a formation process of an insulation layer of the cross section line B-B shown in FIG. 1.
Figure 7C:
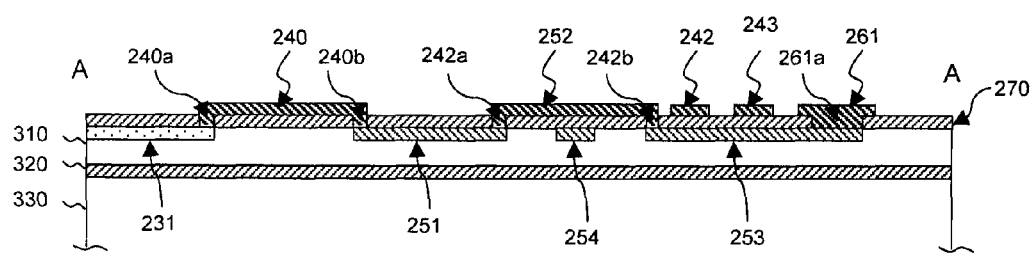
FIG. 7C is a diagram which shows a formation process of a contact hole and upper layer wiring of the cross section line A-A shown in FIG. 2.
Figure 7D:
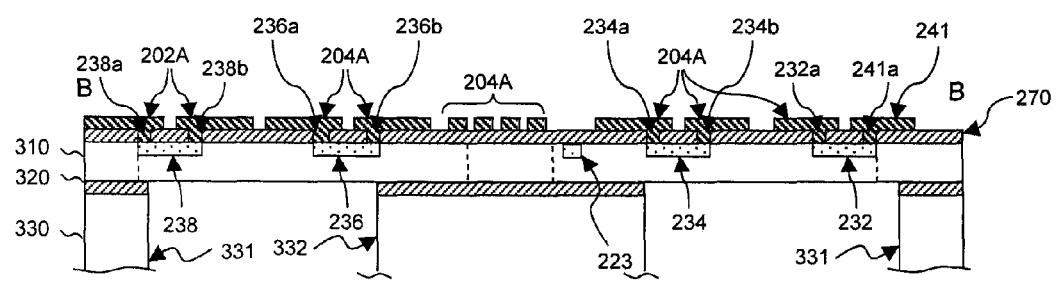
FIG. 7D is a diagram which shows a formation process of a contact hole and upper layer wiring of the cross section line B-B shown in FIG. 1.

In the embodiment described above, forming a contact hole after forming an insulation layer was explained using FIG. 4C. However, the contact hole may be formed, for example after removing an unnecessary silicon oxide film in the latter half of the manufacturing process of a sensor device. The contact hole may be formed in the later half of the manufacturing process of the sensor device, for example, after the unnecessary silicon oxide film is removed as explained in FIG. 5 C. This example will be explained while referring to FIG. 7A, FIG. 7B, FIG. 7C and FIG. 7D. FIG. 7A and FIG. 7C are cross sectional diagrams corresponding to the line A-A in FIG. 2. FIG. 7A is a diagram which shows a formation process of the insulation layer 270 and FIG. 7C is a diagram which shows a formation process of a contact hole and an upper layer wiring. FIG. 7B and FIG. 7D are cross sectional diagram corresponding to the line B-B in FIG. 1. FIG. 7B is a diagram which shows a formation process of the insulation layer 270 and FIG. 7D is a diagram which shows a formation process of a contact hole and an upper layer wiring.

(1) Forming an Insulation Layer (Refer to FIG. 7A and FIG. 7B)

Similar to the process explained using FIG. 4C and FIG. 5A above, a SiO2 layer is formed as the insulation layer 270 using a thermal oxidation or plasma CVD method on the surface of the silicon film 310. A contact hole is not formed in this case.

(2) Forming a Contact Hole and an Upper Layer Wiring (Refer to FIG. 7C and FIG. 7D)

A contact hole is formed on the insulation layer 270 before bonding the glass substrate explained in FIG. 5D above, and the upper layer wiring is formed. The contact holes 240a, 240b, 242a, 242b, and 261a shown in FIG. 3 are formed by RIE using a resist on the insulation layer 270 as a mask, the same as the process explained by FIG. 4C and FIG. 5A above. These contact holes 240a, 240b, 242a, 242b, and 261a correspond to a layout of piezo resistor 231, upper layer wiring 204 and 242 and lower layer wiring 251, 253 shown in FIG. 2. In addition, at the same time the contact holes 232a, 234a, 234b, 236a, 238a, 238b, and 241a are formed by RIE using a resist as a mask on the insulation layer 270. Then, the same as the process explained by FIG. 4D and FIG. 5D above, the first upper layer wiring group 204a and the second upper layer wiring group 204B are formed by films of a metal material such as Al, Al—Si, Al—Nd using a sputter method and patterned. FIG. 7C shows the case where the upper layer wiring 240 and 242 are formed corresponding to the lower layer wiring 251,253, and 254. FIG. 7D shows the case where the first upper layer wiring group 204A which connects the piezo resistors 232, 234, 236, and 238 is formed. Furthermore, a heating process is performed in order to form an ohmic contact between the upper layer wiring 240, the first upper layer wiring group 204a and the piezo resistors 231, 232, 234, 236, and 238. Furthermore, a film such as a silicon nitride film (Si$_3$N$_4$) may be arranged on the upper layer wiring 240 and 242 and the first upper layer wiring group 204A as a protective film. In addition, the second upper layer wiring group 204B is formed in the same way and a silicon nitride film (Si$_3$N$_4$) may also be arranged on the second upper layer wiring group 204B as a protective film.

As stated above, by changing the process for forming a contact hole and upper layer wiring, a wiring layout can be decided at the point where an external circuit connected to the acceleration sensor 200 is decided and it becomes possible to form the contact hole and upper layer wiring last. In this case, it is sufficient to simply change the position where a contact hole is formed according to a wiring layout, the design side burden and manufacturing side burden of changing a wiring pattern within the sensor can be significantly reduced and it becomes possible to suppress an increase in manufacturing costs.

(Transformation Example of a Connection Pad Layout)

Figure 8:
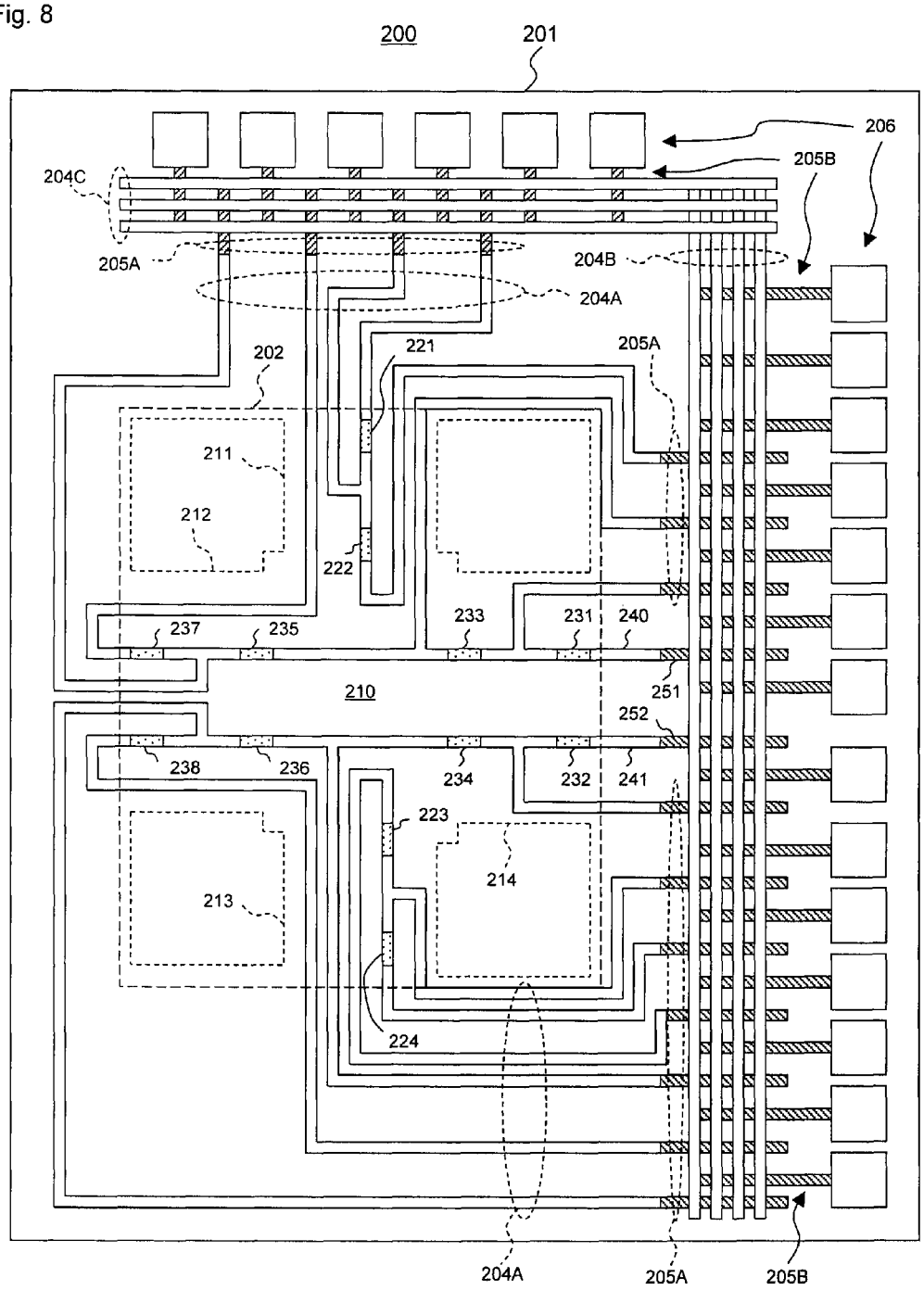
FIG. 8 is a diagram which shows the entire structure of a transformation example of an acceleration sensor related to one embodiment of the present invention.

In the embodiment described above, an example was shown in which a plurality of connection pads 260 where arranged on the right hand side of the substrate 201 shown in FIG. 1. However, this arrangement is not limited. For example, the plurality of connection pads 206 may be arranged on the upper side and right hand side of the substrate 208 as shown in FIG. 8. Furthermore, in the acceleration sensor 200 shown in FIG. 8, the same structural components as in the acceleration sensor 200 shown in FIG. 1 have the same reference symbols.

In the acceleration sensor 200 shown in FIG. 8, a plurality of connection pads 206 are formed on the upper side of the substrate 201 and these connection pads 206 and piezo resistors 221, 222, 235, and 237 are electrically connected which is different to the structure of the acceleration sensor shown in FIG. 1.

The first upper layer wiring group 204A, first lower layer wiring group 205A, third upper layer wiring group 204C and second lower layer wiring group 205B connect the connection pads 206 formed on the upper side and the piezo resistors 221, 222, 235, and 237. The third upper layer wiring group 204C is a newly formed upper layer wiring group. The third upper layer wiring group 204C is formed so as to intersect in perpendicular direction to the first lower layer wiring group 205A and the second lower layer wiring group 205B. Contact holes (not shown in the diagram) are formed at each intersection point where the third upper layer wiring group 204 and the first lower layer wiring group 205A and the second lower layer wiring group 205B intersect on the insulation layer 270 (not shown in the diagram) which is formed between the third upper layer wiring group 204C, the first lower layer wiring group 205A and the second lower layer wiring group 205B.

With the structure described above, in the acceleration sensor 200 shown in FIG. 8, by selecting a contact hole at an intersection part, it is possible to arbitrarily change a wiring pattern which electrically connects the piezo resistors 221, 222, 235, and 237 and the upper side plurality of connection pads 260.

Therefore, in the acceleration sensor 200 shown in FIG. 8, a wiring pattern which electrically connects a plurality of connection pads 206 formed on the right and upper side of the substrate 201 with the piezo resistors 221, 222, 223, 224, 231, 232, 233, 234, 235, 236, 237, and 238 can be changed by simply changing the position of a contact hole which is selected. Consequently, it is possible to change a wiring pattern which electrically connects the piezo resistors and connection pads simply by changing the position of a contact hole which is selected according to the function or arrangement of connection terminals of an external circuit or external IC which is connected to the acceleration sensor 200. As a result, in the acceleration sensor 200 shown in FIG. 8, it is possible to easily change a wiring pattern according to the function or arrangement of connection terminals arranged on an external circuit of external IC without changing the design or manufacturing process of a wiring pattern within the sensor. Therefore, it is possible to significantly reduce the design side burden and manufacturing side burden when changing a wire pattern within a sensor and suppress an increase in manufacturing costs.

Furthermore, the structure of the lower layer wiring group, upper layer wiring group and contact holes is not only applied to the arrangement example of the connection pads 206 shown in FIG. 1 and FIG. 8, but can also be applied to other connection pad arrangement examples. For example, the structure of the lower layer wiring group, upper layer wiring group and contact holes can also be applied when a plurality of connection pads are arranged in the left and right, upper and lower sides of the substrate 201. In addition, more connection pads 206 may be formed than the number of connection terminals of the piezo resistors 221, 222, 223, 224, 231, 232, 233, 234, 235, 236, 237, and 238.

(Transformation Example of an Insulation Layer, Lower Layer Wiring and Upper Layer Wiring)

Figure 9:
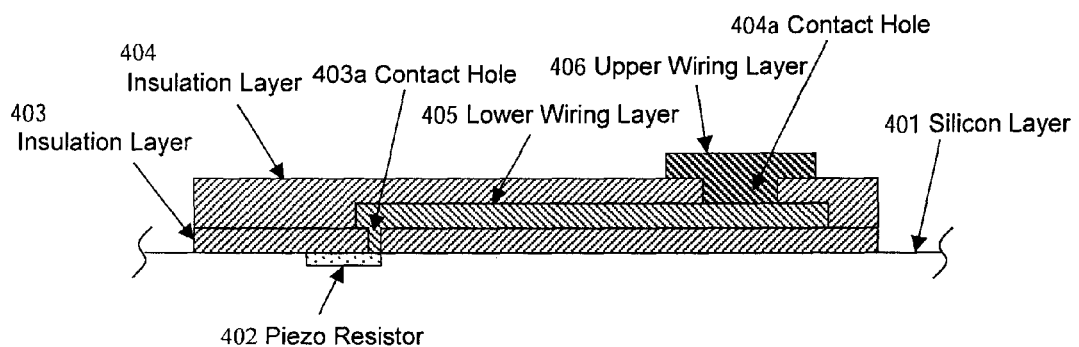
FIG. 9 is a diagram which shows an example of changing and insulation layer, lower layer wiring and upper layer wiring in an acceleration sensor related to one embodiment of the present invention.
Figure 10:
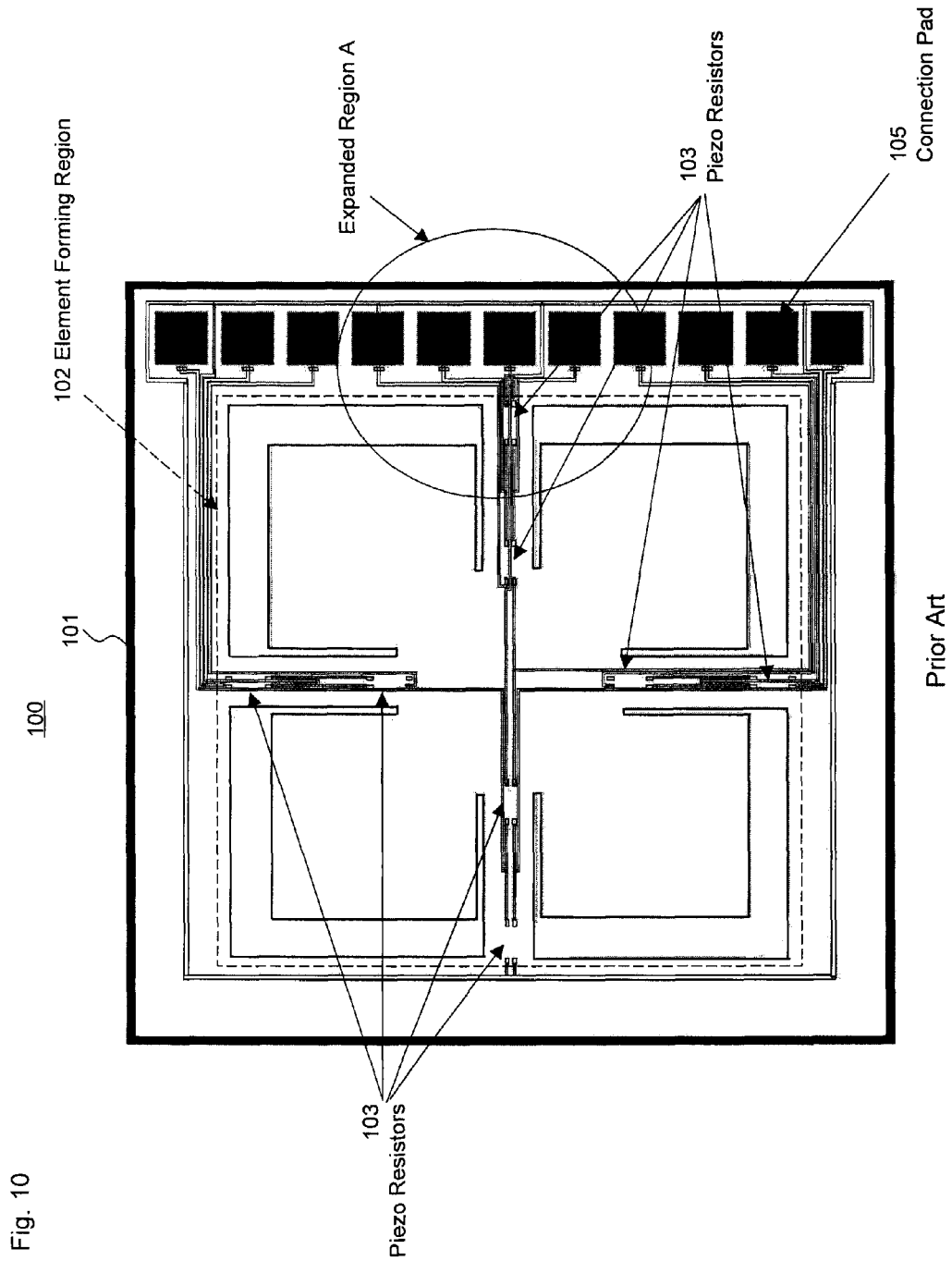
FIG. 10 is a diagram which shows the entire structure of a conventional acceleration sensor.

In the embodiment described above, as is shown in FIG. 4D and FIG. 5D, an example of forming a contact holes in the insulation layer 270 having a one layer structure and forming an upper layer wiring 204A and 204B on a layer above this insulation layer 270 was shown. However, the structure is not limited to this structure. For example, the structure may be formed as is shown in FIG. 9. FIG. 9 is a diagram which shows a cross section of a transformation example of the structure of the insulation layer, lower layer wiring and upper layer wiring.

In FIG. 9, a piezo resistor 402 is formed on a silicon layer 401 (equivalent to the substrate 201), and an insulation layer 403 is formed on a layer above. A contact hole 403a is formed on a part which is electrically connected with the piezo resistor 402 of this insulation layer 403. Next, a lower layer wiring layer 405 which electrically connects the contact hole 403a with an upper layer wiring layer 406 described below is formed on a layer above the insulation layer 403. Next, an insulation layer 404 is formed on a layer above the lower layer wiring layer 405. A contact hole 404a is formed on a part which is electrically connected with an upper layer wiring layer 406 of the insulation layer 404. Next, the upper layer wiring layer 406 (equivalent to connection pads 206) for connecting with an external component is formed on a layer above the insulation layer 404.

The above described structure may be applied to the acceleration sensor 200 shown in FIG. 1 and FIG. 8. As stated above, by selecting a contact hole when electrically connecting a piezo resistor with an upper layer wiring layer it is possible to arbitrarily change the wiring path even when the structure of an insulation layer, lower layer wiring and upper layer wiring is changed.

Consequently, it is possible to change a wiring pattern which electrically connects the piezo resistors and connection pads simply by changing the position of a contact hole which is selected according to the function or arrangement of connection terminals of an external circuit or external IC which is connected to the acceleration sensor 200. As a result, in the acceleration sensor 200 related to the present embodiment, it becomes possible to easily change a wiring pattern according to the function or arrangement of a connection terminal arranged on an external circuit or external IC without changing the design or manufacturing process of a wiring pattern within the sensor. As a result, it is possible to significantly reduce the design side burden and manufacturing side burden when changing a wire pattern within a sensor and suppress an increase in manufacturing costs.

What is claimed is:

1. A sensor device comprising:

a substrate which includes an element forming region;

a plurality of sensor elements arranged on a flexible part within the element forming region;

a plurality of connection pads arranged on a region of the substrate other than the element forming region;

a plurality of first upper layer wiring arranged at least on the flexible part within the element forming region and electrically connected with the plurality of sensor elements;

a plurality of first lower layer wiring arranged on a lower layer than the plurality of first upper layer wiring on a region of the substrate other than the element forming region and electrically connected with the plurality of first upper layer wiring;

a plurality of second lower layer wiring arranged on a same layer as the plurality of first lower layer wiring on a region of the substrate other than the element forming region and electrically connected with the plurality of connection pads;

a plurality of second upper layer wiring arranged on a different layer from the plurality of first lower layer wiring and the plurality of second lower layer wiring and arranged to intersect with the plurality of first lower layer wiring and the plurality of second lower layer wiring; and an insulation layer arranged between the plurality of first lower layer wiring and the plurality of second lower layer wiring and the plurality of second upper layer wiring, and wherein a plurality of through holes are formed on the insulation layer in a position at which the plurality of first lower layer wiring and the plurality of second lower layer wiring intersect with the plurality of second upper layer wiring, and wherein the plurality of first upper layer wiring and the plurality of second upper layer wiring comprise metal material, and the plurality of first lower layer wiring and the plurality of second lower layer wiring comprise a semiconductor including diffused impurities.

2. The sensor device according to claim 1, wherein each of the plurality of second upper layer wiring includes a plurality of first intersection parts which intersect with one end of each of the plurality of first lower layer wiring and a plurality of second intersection parts which intersect with one end of each of the plurality of second lower layer wiring, the plurality of through holes are formed in a position in correspondence with one of the plurality of first intersection parts and a position in correspondence with one of the plurality of second intersection parts, and a wiring pattern which electrically connects the plurality of sensor elements with the plurality of connection pads via the plurality of through holes is changeable.

3. The sensor device according to claim 1, wherein more connection pads of the plurality of connection pads are formed than the number of connection terminals of the plurality of sensor elements.

4. The sensor device according to claim 1, wherein the plurality of second upper layer wiring is formed between the element forming region and the plurality of connection pads.

5. The sensor device according to claim 1, wherein the plurality of through holes are contact holes.

6. The sensor device according to claim 1, wherein the plurality of connection pads are electrically connected with an external circuit within the sensor device.

7. The sensor device according to claim 1, wherein the plurality of sensor elements are a plurality of piezo resistors.

* * * * *